United States Patent [19]
Fahrenbruch

[11] Patent Number: 6,008,667
[45] Date of Patent: Dec. 28, 1999

[54] EMITTER-COUPLED LOGIC TO CMOS LOGIC CONVERTER AND METHOD OF OPERATION

[75] Inventor: Shawn A. Fahrenbruch, Dallas, Tex.

[73] Assignee: Texas Instruments Incorporated, Dallas, Tex.

[21] Appl. No.: 08/974,520

[22] Filed: Nov. 19, 1997

[51] Int. Cl.$^6$ .............................................. H03K 19/0175
[52] U.S. Cl. ................................. 326/66; 326/73; 326/77; 326/84
[58] Field of Search ...................................... 326/126, 127, 326/76, 17, 18, 84, 109, 110, 66, 73, 77

[56] References Cited

U.S. PATENT DOCUMENTS 4,779,016  10/1988  Sugiyama et al. ....................... 307/475
5,059,829  10/1991  Flannagan et al. ...................... 307/475

OTHER PUBLICATIONS

Martin Rau and Hans–Jörg Pfleiderer, "An ECL to CMOS Level Converter with Complementary Bipolar Output Stage," *IEEE Journal of Solid–State Circuits*, pp. 781–787, Jul. 1995.

*Primary Examiner*—Michael Tokar
*Assistant Examiner*—Anh Q Tran
*Attorney, Agent, or Firm*—W. Daniel Swayze, Jr.; Wade James Brady, III; Richard L. Donaldson

[57] ABSTRACT

An emitter-coupled logic to CMOS logic converter includes a first current mirror having a first transistor that has a terminal. The first current mirror is operable to mirror a current in the terminal of the first transistor to produce a mirrored first current. The converter also includes a first current sink operable to generate a first current in the terminal of the first transistor. The converter also includes a second current mirror having a second transistor that has a terminal. The second current mirror is operable to mirror a current in the terminal of the second transistor to produce a mirrored second current. The converter further includes a second current sink operable to generate a second current in the terminal of the second transistor and a differential input pair operable to receive a differential voltage input and direct a current, based on the differential voltage input, to the terminal of the first transistor or the terminal of the second transistor. In addition, the converter includes a third current mirror for mirroring the first mirrored current and the second mirrored current to produce an output voltage that varies in response to changes in the differential voltage input.

13 Claims, 2 Drawing Sheets

EMITTER-COUPLED LOGIC TO CMOS LOGIC CONVERTER AND METHOD OF OPERATION

TECHNICAL FIELD OF THE INVENTION

This invention relates in general to the field of electronic circuitry and more particularly to an emitter-coupled logic to CMOS logic converter and method of operation.

BACKGROUND OF THE INVENTION

The tradeoff between CMOS logic and emitter-coupled logic (ECL) is well understood. CMOS is very good for low to mid-range frequencies because at these frequencies power consumption is low. In addition, the area required for CMOS logic is extremely small. However, as the frequency of an associated clock increases, static CMOS logic design becomes very noisy and requires large amounts of power. At some point it becomes desirable to perform higher frequency operations using ECL. In contrast, the power consumption of an ECL cell is independent of frequency. However, ECL is expensive in terms of silicon die area. Hence, it is common to perform higher frequency logic operations using ECL and lower frequency logic operations using CMOS logic.

Utilization of both of these technologies requires conversion between a high frequency master ECL clock and a high frequency CMOS clock. Such a high frequency CMOS clock may be used as a clock for a state machine that generates slower logic clock signals. This conversion conventionally creates several problems. First, extremely high power is required to generate the conversion. This required power can counteract the power consumption savings of using a mix of ECL and CMOS logic. Such a mix is commonly referred to as mixed mode logic. In addition, the conversion conventionally places a high dependance on the power supply. Furthermore, if the latency period of the conversion, or transport delay, is too long, logic will no longer be synchronously clocked, creating additional clocking problems. In addition, a phenomena known as jitter affects ECL to CMOS converters. Jitter refers to small variations about a common level of a signal, such as a clock signal. Short transport delay and low jitter are desirable attributes of an ECL to CMOS logic converter.

SUMMARY OF THE INVENTION

From the foregoing it may be appreciated that a need has arisen for a method and circuitry for converting emitter-coupled logic to CMOS logic that eliminate or reduce the problems of prior techniques. In accordance with the present invention, an emitter-coupled logic to CMOS logic converter is provided that substantially eliminate the disadvantages and problems outlined previously. The present invention utilizes trickle current sinks to prevent a pair of field-effect transistors from turning fully off to reduce time delay associated with turning on these transistors and therefore reduce the minimum transport delay time as well as any jitter occurring in the converter.

According to one aspect of the invention, an emitter-coupled logic to CMOS logic converter includes a first current mirror having a first transistor that has a terminal. The first current mirror is operable to mirror a current in the terminal of the first transistor to produce a mirrcred first current. The converter also includes a first current sink operable to generate a first current in the terminal of the first transistor. The converter also includes a second current mirror having a second transistor that has a terminal. The second current mirror is operable to mirror a current in the terminal of the second transistor to produce a mirrored second current. The converter further includes a second current sink operable to generate a second current in the terminal of the second transistor and a differential input pair operable to receive a differential voltage input and direct a current, based on the differential voltage input, to the terminal of the first transistor or the terminal of the second transistor. In addition, the converter includes a third current mirror for mirroring the first mirrored current and the second mirrored current to produce an output voltage that varies in response to changes in the differential voltage input.

According to another aspect of the present invention, a method for converting emitter-coupled logic to CMOS logic is provided that includes receiving an emitter-coupled logic voltage signal at an emitter-coupled differential pair. The differential pair has a first side and a second side. The method also includes hot-biasing a first transistor and a second transistor to allow each transistor to turn on rapidly in response to changes in the emitter-coupled voltage input signal. The method also includes mirroring the current in a terminal of the first and second transistors such that an output voltage is generated having the same frequency as the emitter-coupled logic voltage input signal.

The present invention provides a myriad of technical advantages. A technical advantage of the present invention includes relatively good power supply rejection. In addition, the present invention provides low transport delay with a typical conversion time of approximately 1 nS as well as desirable jitter characteristics in the presence of power and ground noise. These desirable operating characteristics may be attributed to the use of trickle current sinks to prevent certain transistors in a converter from turning fully off. Furthermore, the present invention utilizes no PNP structures, which is desirable in processes where PNP structures are expensive. In addition, one implementation of the present invention requires only 20 square mils of die area, including guard rings, in a 0.8 $\mu$M BiCMOS triple metal process, which is desirable.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
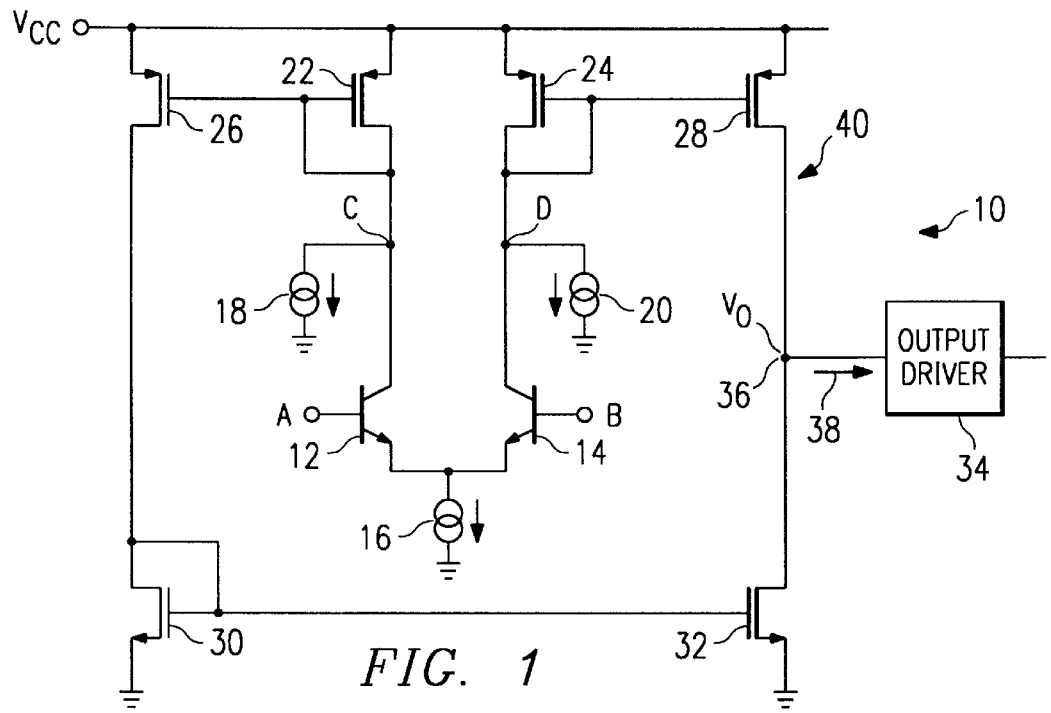
FIG. 1 is a circuit diagram showing an emitter-coupled logic to CMOS logic converter according to the teachings of the present invention.

An embodiment of the present invention and its advantages is best understood by referring to FIGS. 1 through 4 of the drawing, like numerals being used for like corresponding parts of the various drawings.

FIG. 1 is a circuit diagram showing an emitter-coupled logic to CMOS logic converter 10 according to the teachings of the present invention. Converter 10 includes a differential pair of bipolar junction transistors 12 and 14. As illustrated, bipolar junction transistors 12 and 14 are NPN transistors and form a differential input pair. Connected to both emitters of transistors 12 and 14 is a constant current sink 16. Thus transistors 12 and 14 also form an emitter-coupled pair used in emitter-coupled logic. In one embodiment, current sink 16 generates a constant current sink of approximately 1 mA. A first input voltage may be applied at node A, which is connected to the base of transistor 12. Similarly, a second input voltage may be applied at node B, which is connected to the base of transistor 14. Input voltages applied at node A and node B form a differential emitter-coupled logic voltage input.

Converter 10 also includes a pair of trickle current sinks 18 and 20. Trickle current sink 18 provides a trickle current of approximately 10% to 20% of the current generated by current sink 16. Similarly, trickle current sink 20 provides a trickle current approximately equal to 10% to 20% of the current generated by current sink 16. Trickle current sink 18 is connected at one end to node C and at another to ground. Trickle current sink 20 is connected at one end to node D and at another end to ground. As described in greater detail below, trickle current sinks 18 and 20 allow rapid transitions from high to low voltages at the output of converter 10. Transistors from high to low voltages at the output of converter 10 is related to the transport delay of converter 10. The quicker these transitions, the shorter the transport delay. A short transport delay is desirable in emitter-coupled logic to CMOS conversions.

Converter 10 also includes three current mirrors. A first current mirror includes field-effect transistors 22 and 26. As illustrated, field-effect transistors 22 and 26 are P-channel field effect transistors. The drain of transistor 22 is connected to the gates of transistors 22 and 26. Therefore, the sink to drain current of transistor 22 is mirrored to transistor 26, resulting in the same sink to drain current in transistor 26.

Converter 10 also includes a second current mirror that includes field-effect transistors 24 and 28. As illustrated, field-effect transistors 24 and 26 are P-channel field-effect transistors. The drain of transistor 24 is connected to the gates of transistors 24 and 28. Therefore, the drain current in transistor 24 is mirrored to transistor 28, resulting in the same drain current in transistor 28. Transistors 22, 24, 26, and 28 all have their sources connected to a reference voltage $V_{cc}$.

Converter 10 also includes a third current mirror that includes transistors 30 and 32. Transistor 30 is an N-channel field-effect transistor having its drain connected to its gate. Transistor 32 is also an N-channel field-effect transistor having its gate connected to the gate and drain of transistor 30. Therefore, the drain to sink current through transistor 30 is mirrored to transistor 32, resulting in the same drain to sink current in transistor 32. Transistors 30 and 32 each have sources connected to ground. As illustrated in FIG. 1, converter 10 may be manufactured without the use of PNP transistors, which is desirable. PNP transistors are generally more expensive to manufacture than NPN transistors.

Converter 10 receives a differential input voltage at nodes A and B and produces an output voltage $V_0$ at a node 36 having the same frequency as the differential input voltage at nodes A and B. Converter 10 also produces an output current 38. Converter 10 may also include an output driver 34 for amplifying and buffering output current 38. As illustrated in FIG. 1, the configuration of bipolar transistors 12 and 14, current sink 16, and field-effect transistors 22, 24, 26, 28, 30, and 32 form an operational transconductance amplifier 40. The present invention utilizes trickle current sinks 18 and 20 in combination with operational transconductance amplifier 40 to place transistors 22 and 24 to prevent in transistors 22 or 24 from turning completely off. Preventing a transistor from turning fully off may be referred to as hot-biasing. The purpose of hot biasing transistors 22 and 24 may be more readily understood with reference to FIGS. 2A and 2B.

Figure 2A:
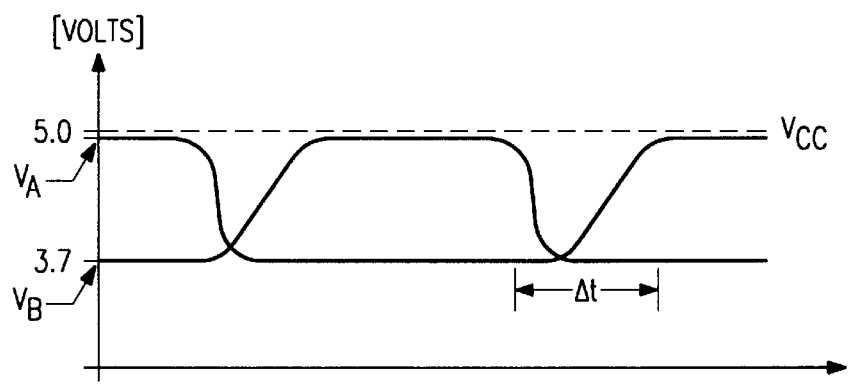
FIG. 2A is a graph illustrating voltage versus time for nodes C and D of FIG. 1, showing delay in charging nodes C and D without incorporating the teachings of the present inventions.
Figure 2B:
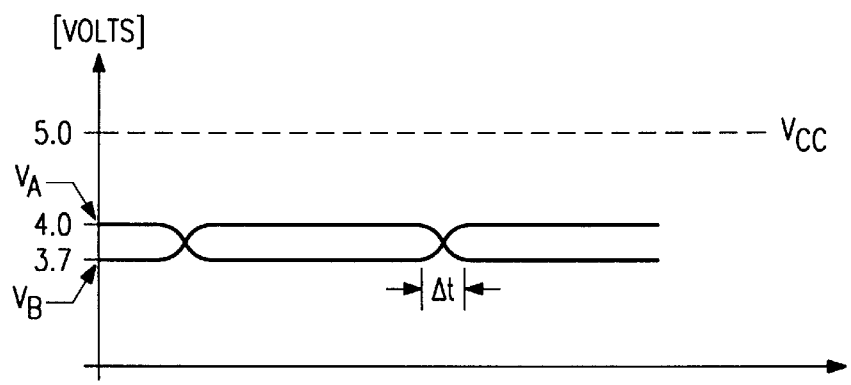
FIG. 2B is a graph of voltage versus time at nodes C and D showing a reduced time for charging when incorporating the teachings of the present invention.

FIG. 2A is a graph illustrating voltage versus time for nodes C and D of FIG. 1, showing delay in charging nodes C and D without incorporating the teachings of the present inventions. FIG. 2B is a graph of voltage versus time at nodes C and D showing a reduced time for charging nodes C and D when incorporating the teachings of the present invention. As described in greater detail below, the voltage at nodes C and D will vary with a differential input voltage applied at nodes A and B. In one example, when the voltage at node A is greater than the voltage at node B, the voltage at node C will assume a value close to $V_{cc}$, which is assumed in this example to be 5 volts. In such a case the voltage at node D will be a lower value of, for example, 3.7 volts. As the voltage at node B exceeds the voltage at rode A, the voltage at node C will decrease to 3.7 volts, and the voltage at node D will approach 5 volts. Because the voltage at node C must transition from a 5 volt level to a 3.7 volt level, which is equal to a 1.3 volt differential, a transition period occurs where the voltage at node C is somewhere between 5 volts and 3.7 volts.

Similarly, a transition period occurs as the voltage at node D transitions from 3.7 volts to 5 volts. This time period, represented by $\Delta T$ in FIG. 2A, is proportional to the transport delay time associated with converter 10. Shorter $\Delta T$ times result in better performance of converter 10. The above example is based upon an assumed absolute value of threshold voltage, or minimum gate-to-source voltage, necessary for conduction by transistors 22 and 24 of approximately 1 volt.

In contrast, the graph illustrated in FIG. 2B utilizes the teachings of the present invention to provide a gate-to-source voltage having an absolute value that just exceeds the threshold voltage of, for example, 1 volt. As described in greater detail below, this is accomplished by the use of trickle current sinks 18 and 20. Trickle current sink 18 sinks a sufficient current through transistor 22 to generate a gate-to-source voltage having an absolute value just greater than approximately 1 volt such that transistor 22 never turns fully off, but rather remains weakly on whenever it would otherwise turn off in the absence of trickle current sink 18. As used herein, transistors 22 and 24 are defined as "weakly on" when they have drain currents of approximately 10–20% of the maximum current that flows through transistors 22 and 24 in its operation as a converter. Thus, in this embodiment, transistors 22 and 24 will be weakly on when trickle current sinks 18 and 20 generate a current of 10 to 20% of the current sink generated by current sink 16. Because the absolute value of the gate-to-source voltage of transistor 22 is approximately 1 volt, the maximum voltage at node C is 4.0 volts. Because transistor 22 always remains on, a small amount of additional current through transistor 22 turns transistor 22 full on, resulting in a rapid transition at node C from, for example, 4.0 volts to 3.7 volts.

In contrast, the transition from 5.0 volts to 3.7 volts shown in FIG. 2B may be attributed to the time required to bring the gate-to-source voltage up to the threshold voltage before transistor 22 is turned fully on. The operation of transistor 24 and the resulting voltages at node D is analogous. As described in greater detail below, the transition of voltages at nodes C and D from high to low values affects, through the current mirrors, the output voltage at node 36. Therefore, a rapid transition of voltages at nodes C and D due to hot-biasing of transistors 22 and 24 results in rapid transition of the output voltage at node 36 from high to low or low to high values.

Figure 3:
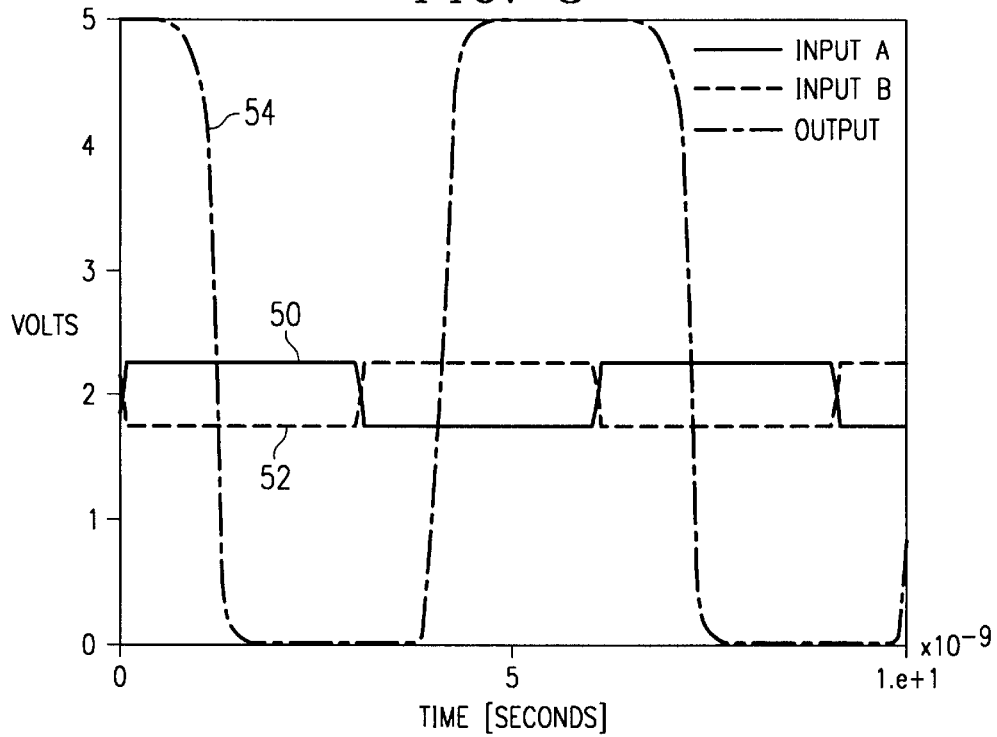
FIG. 3 is a graph illustrating output voltage $V_O$ versus time in comparison to input voltages at nodes A and B.

FIG. 3 is a graph illustrating output voltage $V_0$ versus time and also illustrating input voltages at nodes A and B. As illustrated in FIG. 3, an output voltage at node 36 versus time is represented by curve 54. Curve 50 represents the input voltage at node A and curve 52 represents the input voltage at node B. Differential input voltages at nodes A and B may correspond to, for example, an emitter-coupled logic clock. With reference to FIGS. 1 and 3 the operation of converter 10 is described. With input voltage applied at node A, represented by curve 50, being high and input voltage applied at node B, represented by curve 52, being low, the differential pair of transistors 12 and 14 will steer current through transistor 12 and therefore transistor 22. With input voltage at node A having a high value and input voltage at node B having a low value, the majority of current through the differential pair of transistors 12 and 14 will flow through transistor 12, with minimal current through transistor 14.

The current through transistor 12 and, in addition, the trickle current produced by trickle current sink 18, flows through transistor 22. The sum of these two currents are mirrored to produce the same sink to drain current through transistor 26. Because the majority of the current generated by current sink 16 and flowing through differential pair 12 and 14 flows through transistor 12, only an insignificant current flows through transistor 14. Therefore, the current that flows through transistor 24 and that is mirrored to transistor 28 is only the trickle current generated by trickle current sink 20.

The current through transistor 26 is mirrored by transistors 30 and 32 to produce a drain current through transistor 32 equal to the current through transistor 26, which is equal to the sum of the trickle current produced by trickle current sink 18 and the current through transistor 12. As noted above, trickle current sink 18 generates a trickle current of approximately 10–20% of the current generated by current sink 16. Therefore the total current through the drain of transistor 32 is approximately 110 to 120% of the current generated by current sink 16. Because a much smaller current flows through transistor 28 than through transistor 32, transistor 28 will act as an active load to transistor 32, or a high impedance resistor. Therefore, because transistor 32 is trying to sink more current than transistor 28 can source, the net effect at node 36 is a decrease in voltage to a value equal to ground, resulting in output curve 54 illustrated in FIG. 3.

The time to discharge node 36 is relatively small, because hot-biasing of transistors 22 and 24 allows those transistors to turn full on rapidly. The time delay associated with output voltage curve 54 changing from low to high after the differential input at nodes A and B changes from high to low is approximately 1 nanosecond, which is a desirable transport delay.

Alternatively, if the input voltage at node B is greater than the input voltage at node A, the majority of current flowing through differential pair A and B will be through transistor 14. This current is mirrored by transistors 24 and 28, producing a drain current through transistor 28 having a magnitude equal to the sum of the current generated by current sink 16 and the current generated by trickle current sink 20. A relatively small or insignificant current flows through transistor 12. Therefore, only the current generated by trickle current sink 18 is mirrored by transistors 22 and 26 to produce a sink to drain current in transistor 26, which is in turn mirrored by transistors 30 and 32 through transistor 32. Because the current flowing through the drain of transistor 32 is relatively small in comparison to the current through transistor 28, the current through transistor 28 charges node 36, resulting in node 36 taking on a voltage level of Vcc, or in this example, 5 volts.

The above-described converter possess desirable transport delay characteristics due primarily to the use of trickle current sinks 18 and 20. Trickle current sinks 18 and 20 generate approximately 10% to 20%, each, of the current generated by current sink 16. Trickle current sinks 18 and 20 therefore retain transistors 22 and 24 in a weakly-on state, allowing transistors 22 and 24 to never turn fully off. Without hot-biasing, an additional delay time associated with charging the gate to source voltage across transistors 22 and 24 such that it exceeds the threshold voltage of these transistors would be required. By providing a current through transistors 22 and 24 regardless of the current through differential pair 12 and 14, transistors 22 and 24 are each ready to turn fully on with the slightest amount of additional current through these transistors. The transport delay, or time required to effect a change in voltage at node 36 in response to a voltage change at input nodes A and B, is affected by the time required to turn transistors 22 and 24 fully on. Thus, decreasing the time required to turn transistors 22 and 24 on reduces the transport delay time.

Figure 4:
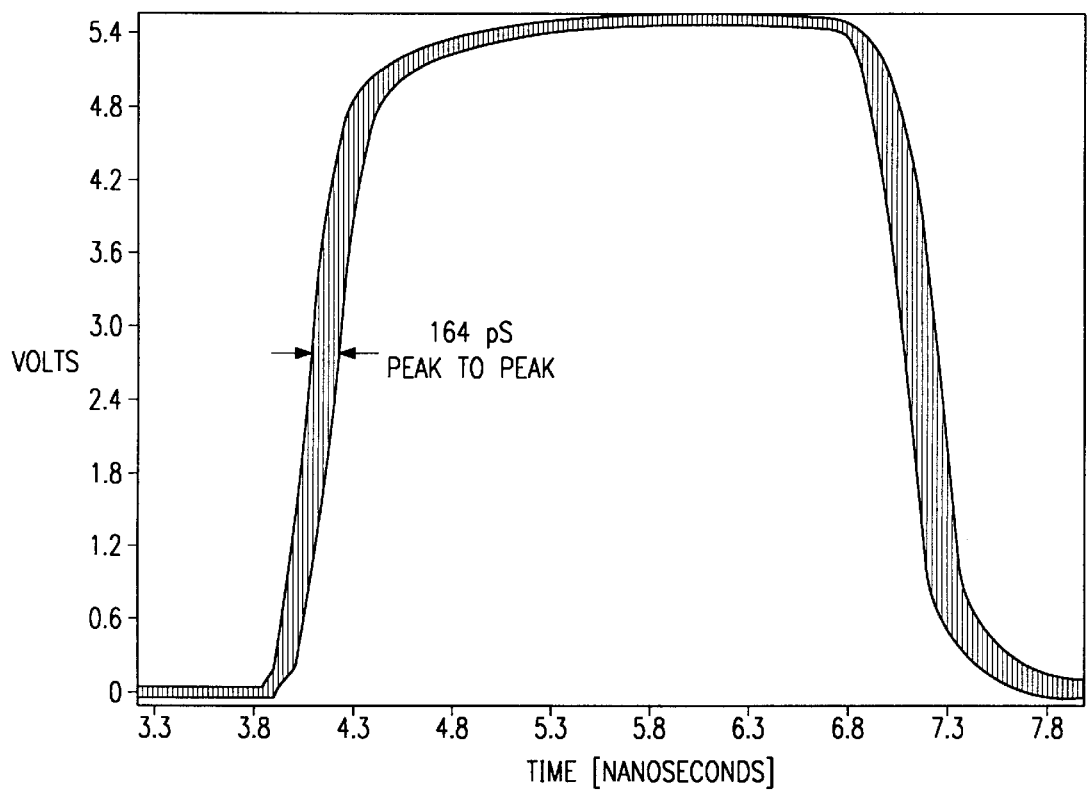
FIG. 4 is a graph of output voltage $V_O$ versus time for numerous executions of the converter illustrated in FIG. 1, showing the desirable jitter performance of the converter constructed according to the teachings of the present invention.

FIG. 4 is a graph of output voltage $V_0$ at node 36 versus time for numerous executions of converter 10 and illustrates the desirable jitter performance of the present invention. The shaded portions of this curve represent a multitude of values that are taken on by output voltage $V_0$ at node 36 over time for numerous operations of converter 10. The shaded region includes a plurality of values about an average line for the output voltage $V_0$ at node 36 versus time. This deviation from an average value is referred to as jitter. As illustrated, the peak-to-peak jitter is approximately 164 picoseconds, which is a reasonable jitter performance level. This jitter performance level may be attributed to providing a rapid change from high to low or low to high values at output node 36, which is related to the time required to turn transistors 24 and 28 fully on. A rapid change from high to low or low values to high at output node 36 minimizes the time available for the introduction of noise from power supply fluctuations, ground fluctuations, or substrate fluctuations. The occurrence of these fluctuations during changes from a high to low or low to high value, causes jitter.

Although the present invention and its advantages have been described in detail, it should be understood that various changes, substitutions, and alterations can be made therein without departing from the spirit and scope of the present invention as defined by the appended claims.

What is claimed is:

1. An emitter-coupled logic to CMOS logic converter, the converter comprising:
   an operational transconductance amplifier comprising:
      first and second differential input nodes and an output node;

a first transistor having a control terminal connected to the first input node and a second transistor having a control terminal connected to the second input node; and a first current sink operable to sink current through the first and second transistors;

a third transistor forming a portion of a first current mirror, the third transistor having a terminal for receiving current therethrough from the first current sink based on a differential input voltage applied at the first and second differential input nodes;

a fourth transistor forming a portion of a second current mirror, the fourth transistor having a terminal for receiving a current therethrough from the first current sink based on the differential input voltage applied at the first and second differential input nodes;

a second current sink connected to a terminal of the third transistor such that the second current sink is operable to sink sufficient current through the third transistor to prevent the third transistor from turning fully off;

a third current sink connected to a terminal of the fourth transistor such that the third current sink is operable to sink sufficient current through the fourth transistor to prevent the fourth transistor from turning fully off; and wherein a change in a voltage differential applied to the first and second differential input nodes results in an associated change in voltage at the output node.

2. The converter of claim 1, wherein the third transistor is a P-channel FET having a source and a drain and wherein the terminal of the third transistor is the drain of the first transistor.

3. The converter of claim 2, wherein the third transistor is an N-channel FET having a source and a drain and wherein the terminal of the third transistor is the source of the P-channel FET.

4. The converter of claim 1, wherein the first and second transistors comprise:

a first bipolar transistor having a base connected to the first differential input node;

a second bipolar transistor having a base connected to the second differential input node; and wherein the first current sink is connected to the emitter of the first bipolar transistor and the first current sink is connected to the emitter of the second bipolar transistor.

5. The converter of claim 1, wherein the second current sink and third current sink each provide a current having a magnitude of approximately 10% to 20% of the current generated by the first current sink.

6. The converter of claim 1, wherein the first current sink provides a current of approximately 1 mA and the second and third current sinks each provide a current of approximately 100 to 200 μA.

7. The converter of claim 1, wherein the first and second transistors comprise first and second bipolar junction transistors having emitters connected to the first current source.

8. An emitter-coupled logic to CMOS logic converter, the converter comprising:

a first current mirror comprising a first transistor, the first transistor having a terminal, the first current mirror operable to mirror a current in the terminal of the first transistor to produce a mirrored first current;

a first current sink operable to generate a first current in the terminal of the first transistor;

a second current mirror comprising a second transistor, the second transistor having a terminal, the second current mirror operable to mirror a current in the terminal of the second transistor to produce a mirrored second current;

a second current sink operable to generate a second current in the terminal of the second transistor;

a differential input pair operable to receive a differential voltage input and direct a current, based on the differential voltage input, to the terminal of the first transistor or the terminal of the second transistor;

a third current mirror for mirroring the first mirrored current and the second mirrored current to produce an output voltage that varies in response to changes in the differential voltage input;

wherein the differential input pair further comprises a third current sink for selectively sinking current through the terminal of the first transistor or the terminal of the second transistor based on the differential voltage input, and wherein the third current sink generates a current of approximately 1 mA.

9. An emitter-coupled logic to CMOS logic converter, the converter comprising:

a first current mirror comprising a first transistor, the first transistor having a terminal, the first current mirror operable to mirror a current in the terminal of the first transistor to produce a mirrored first current;

a first current sink operable to generate a first current in the terminal of the first transistor;

a second current mirror comprising a second transistor, the second transistor having a terminal, the second current mirror operable to mirror a current in the terminal of the second transistor to produce a mirrored second current;

a second current sink operable to generate a second current in the terminal of the second transistor;

a differential input pair operable to receive a differential voltage input and direct a current, based on the differential voltage input, to the terminal of the first transistor or the terminal of the second transistor;

a third current mirror for mirroring the first mirrored current and the second mirrored current to produce an output voltage that varies in response to changes in the differential voltage input;

wherein the differential input pair further comprises a third current sink for selectively sinking current through the terminal of the first transistor or the terminal of the second transistor based on the differential voltage input, and wherein the first and second current sinks generate a current of approximately 10% to 20% of the current generated by the third current sink.

10. The converter of claim 8, wherein the first and second current sinks generate a current of approximately 100 to 200 μA.

11. A method for converting an emitter-coupled logic signal into a CMOS signal, the method comprising the steps of:

receiving an emitter-coupled logic voltage signal at an emitter-coupled differential pair, the differential pair having a first side and a second side, the received emitter-coupled logic voltage controlling current through the first and second sides of the differential pair;

hot-biasing a first transistor and a second transistor to allow each transistor to turn fully on rapidly in response to changes in the emitter-coupled voltage input signal, the first transistor having a terminal connected to the first side of the differential pair for receiving a current therethrough from the differential pair and the second transistor having a terminal connected to the second side of the differential pair for receiving current therethrough; and mirroring the current in the terminal of the first and second transistors such that an output voltage is generated having the same frequency as the emitter-coupled logic voltage signal, wherein the step of hot-biasing the first and second transistors comprises the step of connecting a first current sink to a terminal of the first transistor and a second current sink to a terminal of the second transistor.

12. The method of claim 11, wherein the step of connecting a first current sink to a terminal of the first transistor and a second current sink to a terminal of the second transistor comprises connecting a first current sink to a drain of the first transistor and a second current sink to a drain of the second transistor.

13. A method for converting an emitter-coupled logic signal into a CMOS signal, the method comprising the steps of:

receiving an emitter-coupled logic voltage signal at an emitter-coupled differential pair, the differential pair having a first side and a second side, the received emitter-coupled logic voltage controlling current through the first and second sides of the differential pair;

hot-biasing a first transistor and a second transistor to allow each transistor to turn fully on rapidly in response to changes in the emitter-coupled voltage input signal, the first transistor having a terminal connected to the first side of the differential pair for receiving a current therethrough from the differential pair and the second transistor having a terminal connected to the second side of the differential pair for receiving current therethrough; and mirroring the current in the terminal of the first and second transistors such that an output voltage is generated having the same frequency as the emitter-coupled logic voltage signal, and further comprising the step of sinking a current through the differential pair with a first current source and wherein the step of hot biasing a first transistor and a second transistor comprises sinking a second current and a third current through the first transistor and the second transistor with a current having a magnitude of approximately 10–20% of the current sunk through the differential pair.

* * * * *